United States Patent
Yatabe et al.

(10) Patent No.: US 8,975,172 B2
(45) Date of Patent: Mar. 10, 2015

(54) SOLAR CELL ELEMENT AND METHOD FOR MANUFACTURING SOLAR CELL ELEMENT

(75) Inventors: Rui Yatabe, Higashiomi (JP); Kenichi Kurobe, Higashiomi (JP); Yosuke Inomata, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 1039 days.

(21) Appl. No.: 12/443,421

(22) PCT Filed: Sep. 27, 2007

(86) PCT No.: PCT/JP2007/068893
§ 371 (c)(1),
(2), (4) Date: Oct. 9, 2009

(87) PCT Pub. No.: WO2008/047567
PCT Pub. Date: Apr. 24, 2008

(65) Prior Publication Data
US 2010/0037946 A1     Feb. 18, 2010

(30) Foreign Application Priority Data

Sep. 27, 2006 (JP) .................... 2006-263341
Nov. 29, 2006 (JP) .................... 2006-321153

(51) Int. Cl.
*H01L 31/18* (2006.01)
*H01L 21/223* (2006.01)
(Continued)

(52) U.S. Cl.
CPC .......... *H01L 31/1864* (2013.01); *H01L 31/068* (2013.01); *H01L 21/18* (2013.01);
(Continued)

(58) Field of Classification Search
USPC ............ 136/243–265; 427/58–124, 523–531; 438/57
See application file for complete search history.

(56) References Cited

U.S. PATENT DOCUMENTS 3,872,494 A * 3/1975 Davis et al. ................... 257/592
T102,801 I4 * 3/1983 Hovel ........................... 136/255
(Continued)

FOREIGN PATENT DOCUMENTS

JP 55-082472 6/1980
JP 56-122174 9/1981
(Continued)

OTHER PUBLICATIONS

Japanese language office action dated Nov. 29, 2011 and its English language translation for corresponding Japanese application 2008539724.
(Continued)

*Primary Examiner* — Jayne Mershon
(74) *Attorney, Agent, or Firm* — Procopio, Cory Hargreaves & Savitch LLP

(57) ABSTRACT

[Object] To provide a method for manufacturing a solar cell element including a semiconductor substrate that includes a high-concentration dopant layer located near the surface of the semiconductor substrate and a low-concentration dopant layer located more inside the semiconductor substrate than the high-concentration dopant layer.
[Solving Means] A method includes heating a semiconductor substrate having a first conductivity type in a first atmosphere which contains a dopant having a second conductivity type and which has a first dopant concentration; heating in a second atmosphere the semiconductor substrate heated in the first atmosphere, the second atmosphere having a second dopant concentration less than the first dopant concentration; and heating in a third atmosphere the semiconductor substrate heated in the second atmosphere, the third atmosphere having a third dopant concentration greater than the second dopant concentration.

10 Claims, 5 Drawing Sheets

(51) Int. Cl.
  *H01L 31/068* (2012.01)
  *H01L 31/04* (2014.01)
  H01L 21/18 (2006.01)
  H01L 31/0224 (2006.01)
  H01L 31/0236 (2006.01)

(52) U.S. Cl.
  CPC ...... *H01L31/1804* (2013.01); *H01L 31/022425* (2013.01); *H01L 31/04* (2013.01); *Y02E 10/52* (2013.01); *H01L 31/02363* (2013.01)
  USPC .............................. 438/560; 438/96; 438/97

(56) References Cited

U.S. PATENT DOCUMENTS

| | | | | |
|---|---|---|---|---|
| 5,702,538 | A * | 12/1997 | Endros et al. | 136/258 |
| 6,207,557 | B1 * | 3/2001 | Lee et al. | 438/648 |
| 6,251,756 | B1 * | 6/2001 | Horzel et al. | 438/510 |
| 7,427,526 | B2 * | 9/2008 | Fonash et al. | 438/33 |
| 2004/0159285 | A1 * | 8/2004 | Doehler et al. | 118/718 |
| 2005/0023082 | A1 * | 2/2005 | Korchagin et al. | 182/82 |
| 2005/0126627 | A1 * | 6/2005 | Hayashida | 136/257 |
| 2007/0023081 | A1 * | 2/2007 | Johnson et al. | 136/258 |

FOREIGN PATENT DOCUMENTS

| | | |
|---|---|---|
| JP | 58-017681 | 2/1983 |
| JP | 02-060172 | 2/1990 |
| JP | 02-143467 | 6/1990 |
| JP | 03-159179 | 7/1991 |
| JP | 04-348082 | 12/1992 |
| JP | 2005-228792 | 8/2005 |

OTHER PUBLICATIONS

Japanese language office action dated Mar, 27, 2012 and its English translation issued in corresponding Japanese application 2008539724.

* cited by examiner (a)

(b)

(a)

(b)

(c)

F I G . 4
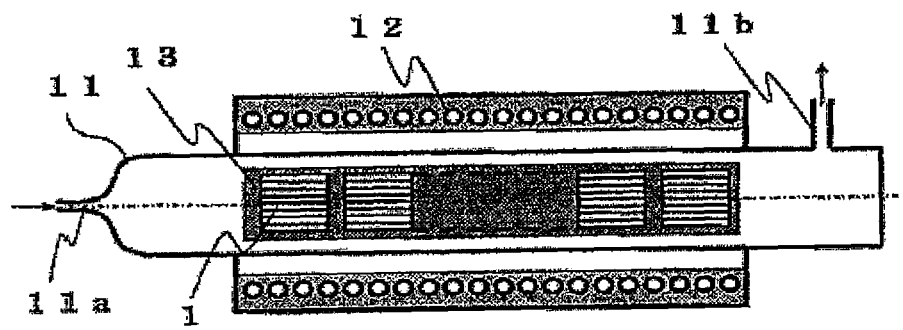

(a)

(b)

(c)

SOLAR CELL ELEMENT AND METHOD FOR MANUFACTURING SOLAR CELL ELEMENT

CROSS-REFERENCE TO RELATED APPLICATIONS

This application is a national stage of International Application No. PCT/JP2007/068893 filed on Sep. 27, 2007, and claims the benefit of priority under 35 USC 119 of Japanese Patent Application No. 2006-263341 filed on Sep. 27, 2006; Japanese Patent Application No. 2006-321153 filed Nov. 29, 2006 which are incorporated herein by reference.

TECHNICAL FIELD

The present invention relates to a solar cell element and a method for manufacturing the solar cell element.

BACKGROUND ART

Solar cell elements convert solar energy into electrical energy.

A conventional method for manufacturing a solar cell element will now be described. A semiconductor substrate with a first conductivity type is prepared. The semiconductor substrate is subjected to gaseous diffusion in such a manner that the semiconductor substrate is exposed to an atmosphere containing an impurity with a second conductivity type at high temperature, whereby a second conductivity-type layer is formed in the semiconductor substrate. When the semiconductor substrate is of a p-type, an n-type layer is formed in the semiconductor substrate and therefore a pn junction is formed between the n-type layer and a p-type layer. Electrodes are each formed on a light-receiving surface of the semiconductor substrate and the back surface thereof, whereby the solar cell element is obtained.

Patent Document 1: Japanese Unexamined Patent Application Publication No. 2-60172

DISCLOSURE OF INVENTION

Problems to be Solved by the Invention

Since the above solar cell elements are expected to be more widely used, it is important for the solar cell elements to have high conversion efficiency. For the enhancement of conversion efficiency, it is important to reduce the resistance of second conductivity-type layers and reduce the recombination loss of photogenerated carriers.

The present invention has been made in view of the foregoing circumstances. It is an object of the present invention to manufacture a high-performance solar cell element.

Means for Solving the Problems

A method for manufacturing a solar cell element according to the present invention is characterized in including heating a semiconductor substrate having a first conductivity type in a first atmosphere which contains a dopant having a second conductivity type and which has a first dopant concentration; heating in a second atmosphere the semiconductor substrate heated in the first atmosphere, the second atmosphere having a second dopant concentration less than the first dopant concentration; and heating in a third atmosphere the semiconductor substrate heated in the second atmosphere, the third atmosphere having a third dopant concentration greater than the second dopant concentration.

Advantages

In a method for manufacturing a solar cell element according to the present invention, a semiconductor substrate having a first conductivity type is heated in a first atmosphere which contains a dopant having a second conductivity type and which has a first dopant concentration, heated in a second atmosphere having a second dopant concentration less than the first dopant concentration, and then heated in a third atmosphere having a third dopant concentration greater than the second dopant concentration. This allows the dopant concentration of a portion of a second conductivity-type layer that is located on the surface side of the semiconductor substrate to be significantly greater than the dopant concentration of a portion of the second conductivity-type layer that is located on the inner side of the semiconductor substrate. Therefore, the solar cell element can be configured such that the recombination loss of carriers generated in the solar cell element is reduced and the resistance of the second conductivity-type layer is reduced.

PREFERRED EMBODIMENTS FOR CARRYING OUT THE INVENTION

Embodiments of solar cell elements according to the present invention and methods for manufacturing the solar cell elements will now be described in detail with reference to the accompanying drawings.

FIG. 1 is a sectional view of a solar cell element according to an embodiment of the present invention. FIG. 2(a) is a plan view of a first surface (light-receiving surface) of the solar cell element shown in FIG. 1. FIG. 2(b) is a second surface (a surface opposite to the light-receiving surface) of the solar cell element shown in FIG. 1.

The solar cell element of this embodiment includes a substrate 1 with a first conductivity type and a second conductivity-type layer 2 disposed in the substrate 1. The second conductivity-type layer 2 has an inner-side portion (a low-concentration dopant layer) 2a and surface-side portion (a high-concentration dopant layer) 2b different in dopant concentration from each other, the inner-side portion 2a being located on the inner side of the semiconductor substrate 1. In the second conductivity-type layer 2, which is disposed in the semiconductor substrate 1, the second conductivity-type layer 2b, which is located on the surface side, has a dopant concentration greater than the dopant concentration of the second conductivity-type layer 2a located on the inner side. This allows the solar cell element to be configured such that the recombination loss of carriers generated in the solar cell element is reduced and the second conductivity-type layer 2 has reduced resistance. In the present invention, the first conductivity type and the second conductivity type may be a p-type and an n-type, respectively, or may be the n-type and the p-type, respectively.

[Method for Manufacturing Solar Cell Element]

(First Embodiment)

A first embodiment of the present invention will now be described with reference to FIGS. 3 and 4. FIG. 3 is a schematic sectional view illustrating steps of a method for manufacturing a solar cell element according to the first embodiment. A semiconductor substrate 1 having a first conductivity type is heated in a first atmosphere which contains a dopant having a second conductivity type and which has a first dopant concentration. The semiconductor substrate 1 is heated in a second atmosphere having a second dopant concentration less than the first dopant concentration. The semiconductor substrate 1 is then heated in a third atmosphere having a third dopant concentration greater than the second dopant concentration.

Since the solar cell element of this embodiment is manufactured through such steps, the concentration of the dopant in the semiconductor substrate 2 sharply increases from a low-concentration dopant layer 2a toward a high-concentration dopant layer 2b. Therefore, the presence of the high-concentration dopant layer 2b, which is located near the surface of the semiconductor substrate, allows the number of carriers responsible for electrical conduction to be increased and allows a photocurrent to be efficiently transmitted to an electrode. Furthermore, the presence of the low-concentration dopant layer 2a, which is located more inside the substrate than the high-concentration dopant layer 2b, allows the recombination rate of the carriers in the low-concentration dopant layer 2a to be reduced and allows the photocurrent generated by photoelectric conversion to be increased. The presence of an internal electric field between the high-concentration dopant layer 2b and the low-concentration dopant layer 2a allows the recombination rate of the carriers present in the second conductivity-type layer 2 to be reduced. Therefore, carriers traveling toward the surface of the substrate 1 do not reach the surface thereof but are likely to travel toward a pn junction; hence, the carriers can be efficiently extracted through the electrode and the sensitivity to short-wavelength light can be particularly increased.

The solar cell element-manufacturing method of this embodiment is described below in detail.

[Preparation of Semiconductor Substrate]

The semiconductor substrate 1 used in this embodiment is made of single-crystalline or polycrystalline silicon containing, for example, a semiconductor impurity such as boron (B). The use of a polycrystalline silicon substrate as the semiconductor substrate 1 is suitable for large-scale production. The semiconductor substrate 1 is produced in such a manner that an ingot produced by a pulling process or a casting process is cut into pieces with a size of 10 cm×10 cm to 25 cm×25 cm and the pieces are cut into slices with a thickness of 500 μm or less, more preferably 250 μm or less. Cut surfaces of the semiconductor substrate 1 are slightly etched with NaOH, KOH, hydrofluoric acid, or fluoronitric acid and therefore are clean.

A surface of the semiconductor substrate 1 on which sunlight is incident is treated by a dry or wet etching process so as to have an irregular (rough) structure. In particular, if a light-receiving surface of the semiconductor substrate 1 is roughened, the reflection of sunlight by the light-receiving surface of the semiconductor substrate 1 can be reduced.

[Formation of Second Conductivity-type Layer]

A second conductivity-type layer 2 is formed on the light-receiving side of the semiconductor substrate 1, whereby a pn junction is formed between the second conductivity-type layer 2 and a bulk region. When the first conductivity type is a p-type, the second conductivity-type layer 2 is becomes an n-type layer 2. An n-type doping element is, for example, a group-V element such as phosphorus (P) and an n$^+$-type layer with a sheet resistance of about 30 to 300 Ω/square is obtained. When the first conductivity type is an n-type, the second conductivity-type layer 2 is becomes a p-type layer 2. A p-type doping element is, for example, a group-III element such as boron (B). The expressions "p+" and "n+", mean that the concentration of an impurity is high.

In this embodiment, the second conductivity-type layer is formed so as to include the high-concentration dopant layer 2b and the low-concentration dopant layer 2a. A method for forming the second conductivity-type layer 2 is described below.

For example, a diffusion apparatus shown in FIG. 4 can be used to form the second conductivity-type layer 2. With reference to FIG. 4, the diffusion apparatus includes a process tube 11 having a gas inlet 11a and a gas outlet 11b. The process tube 11 is heated at high temperature with a heater 12. The semiconductor substrate 1 is laid on a boat 13 placed in the process tube 11 and gas containing an impurity is then introduced through the gas inlet 11a, whereby the impurity is diffused in the semiconductor substrate 1.

In the case where, for example, phosphorus is diffused in the semiconductor substrate 1, a diffusion gas is generated by bubbling liquid $POCl_3$ with a carrier gas (for example, a nitrogen gas, an oxygen gas, or the like) and is then introduced into the process tube 11 together with an inert gas. $PH_3$, $PCl_3$, or the like may be used instead of $POCl_3$. In the case where boron is diffused therein, the diffusion gas is generated by allowing a carrier gas to flow on liquid $BBr_3$ and is then introduced into the process tube 11 together with the inert gas.

The term "an atmosphere containing a dopant" as used herein means such a state that the diffusion gas and the inert gas are introduced into the process tube 11. The term "the concentration of a dopant is lower or higher as compared to a predetermined step" as used herein means that the ratio of the flow rate of the diffusion gas to that of the inert gas is lower or higher as compared to a predetermined step.

[First Step]

In a first step, the semiconductor substrate 1 is heat-treated in an atmosphere containing the dopant, which has the second conductivity type, as shown in FIG. 3(a).

In particular, the semiconductor substrate 1 is heat-treated at a temperature of about 600° C. to 900° C. for 5 to 30 minutes in the dopant-containing atmosphere, whereby an oxide layer 7 containing the dopant is formed on the surface of the semiconductor substrate 1 and the dopant present in the oxide layer 7 is diffused in a surface portion of the semiconductor substrate 1. The ratio of the flow rate of the diffusion gas to that of the inert gas is preferably set from 1:2 to 1:20 and more preferably 1:4 to 1:15.

When the heat treatment temperature of the first step is lower than the heat treatment temperature of a third step below, the concentration of the dopant diffused in the semiconductor substrate can be controlled to be low in such a manner that the amount of the dopant present in the oxide layer 7 is set to a relatively low value; hence, a good low-concentration dopant layer can be formed in the substrate. The heat treatment temperature of the first step is set a temperature that is 30° C. or more lower than the heat treatment temperature of the third step.

[Second Step]

In a second step, the semiconductor substrate 1 is heat-treated in an atmosphere having a dopant concentration less than that of the atmosphere used in the first step as shown in FIG. 3(b).

In particular, the substrate is heat-treated at a temperature that is 50° C. to 200° C. higher than the heat treatment temperature of the first step for about 10 to 40 minutes in an inert gas atmosphere containing argon, nitrogen, or the like, whereby the dopant present in the oxide layer 7, which is disposed on the substrate, is diffused in the surface portion of the semiconductor substrate and the dopant diffused in the surface portion of the semiconductor substrate 1 is diffused in the substrate; hence, the low-concentration dopant layer 2a is formed near the surface of the semiconductor substrate 1.

The atmosphere used in the second step has a dopant concentration less than that of the atmosphere used in the first step. In particular, heat treatment is performed in an atmosphere containing no dopant, that is, heat treatment is performed in the inert gas atmosphere, in which the flow rate of the diffusion gas is zero, and therefore the concentration of the dopant can be sharply decreased from the surface portion of the semiconductor substrate toward the inside thereof.

The heat treatment temperature of the second step is preferably 750° C. or higher. This allows the low-concentration dopant layer $2a$, which has a low dopant concentration, to be formed in a short process time, leading to an increase in productivity.

[Third Step]

In the third step, the semiconductor substrate 1 is heat-treated in an atmosphere having a dopant concentration less than that of the atmosphere used in the second step as shown in FIG. 3(c).

In particular, the substrate is heat-treated at a temperature higher than or equal to the heat treatment temperature of the second step for about 5 to 20 minutes in an atmosphere containing the dopant, whereby the oxide layer 7, which has a high dopant concentration, is formed on the semiconductor substrate 1 again and the dopant present in the oxide layer 7 is diffused in the surface portion of the semiconductor substrate. This results in the formation of the high-concentration dopant layer $2b$.

In the third step, heat treatment is performed in an atmosphere having a dopant concentration greater than that of the atmosphere used in the second step. That is, the ratio of the flow rate of the diffusion gas to that of the inert gas is preferably set from 1:2 to 1:20 and more preferably 1:4 to 1:15. This allows the dopant concentration of the surface portion of the semiconductor substrate to be maintained high, increases the number of carriers responsible fox electrical conduction to efficiently transmit a photocurrent to an electrode, and allows the contact between the semiconductor substrate and the electrode to be increased.

The heat treatment temperature of the third step is preferably 760° C. or higher. This temperature condition is preferred in view of the solubility limit of the dopant and in view of the contact of the electrode.

After the third step is performed, the oxide layer 7, which is disposed on the semiconductor substrate, may be removed by wet etching or the like using an acid mixture (a mixture prepared by mixing hydrofluoric acid and nitric acid at a ratio of 1:10) or a hydrofluoric acid-containing solution such as an aqueous solution containing 0.1 to 50 weight percent hydrofluoric acid.

As described above, through the first to third steps, the high-concentration dopant layer $2b$, which has a high dopant concentration, can be formed so as to be located near the surface of the semiconductor substrate 1 and the low-concentration dopant layer $2a$, which has a low dopant concentration, can be formed so as to extend from the surface toward the inside of the substrate.

The high-concentration dopant layer $2b$ has a portion which is located at a depth of about 10 nm from the surface and which has a dopant concentration of about $8\times10^{20}$ [atoms/cm$^3$]. The low-concentration dopant layer $2a$ has a portion which is located at a depth of about 30 to 100 nm from the surface and which has a dopant concentration of $1\times10^{19}$ [atoms/cm$^3$] or less.

In this embodiment, the method may further include a fourth step of heat-treating the semiconductor substrate in an atmosphere having a dopant concentration less than that of the atmosphere used in the third step. In this case, the dopant present in the high-concentration dopant layer $2b$, which is located near the surface of the semiconductor substrate 1, can be electrically activated. If the fourth step is performed in an atmosphere containing no dopant, the re-diffusion of the dopant diffused in the semiconductor substrate 1, particularly diffused in the high-concentration dopant layer $2b$, can be suppressed in such a manner that the heat treatment temperature of the fourth step is reduced to lower than the heat treatment temperature of the third step. The heat treatment temperature of the fourth step is preferably, for example, 30° C. or more lower than the heat treatment temperature of the third step.

The dopant profile of the second conductivity-type layer 2 has a dopant concentration gradient of 50 nm/decade or less from the position of the peak concentration toward the inside of the substrate 1. The presence of such a concentration gradient allows the solar cell element to have a configuration in which a narrow region located near the light-receiving surface of the substrate has a high dopant concentration and the concentration of the dopant sharply decreases from the surface of the substrate 1 toward the inside thereof. The low-concentration dopant layer $2a$ reduces the recombination rate of minority carriers to increase the photocurrent generated by photoelectric conversion. The high-concentration dopant layer $2b$, which is located near the surface of the substrate 1, increases the number of carriers responsible for electrical conduction to allow a photocurrent to be efficiently transmitted to the electrode. Furthermore, the contact between the substrate 1 and the electrode is increased.

The unit [nm/decade] expresses a substrate depth, in nm, at which the concentration of the dopant is reduced by $1\times10$ [atoms/cm$^3$]. When the substrate depth from a peak concentration of $1\times10^{21}$ [atoms/cm$^3$] to a concentration of $1\times10^{20}$ [atoms/cm$^3$] is, for example, 30 nm, the concentration gradient of the dopant is 30 nm/decade.

A position corresponding to a doping concentration of $1\times10^{17}$ [atoms/cm$^3$] is preferably 0.25 μm or more apart from the position of the peak concentration toward the inside of the substrate. Since the low-concentration dopant layer $2a$ is thick in the inward direction of the substrate 1, the recombination rate of minority carriers present in this region is reduced and the photocurrent generated by photoelectric conversion is increased. The use of the solar cell element according to the present invention reduces the contact resistance between the electrode and the silicon substrate and the sensitivity of the solar cell element to short-wavelength light can be increased. This allows the solar cell element to have high efficiency.

When the position corresponding to a doping concentration of $1\times10^{17}$ [atoms/cm$^3$] is less than 0.25 μm apart from the position of the peak concentration toward the inside of the substrate, the region of the low-concentration dopant layer $2a$ is narrow and therefore the photocurrent generated from the solar cell element using short-wavelength light cannot be increased. Furthermore, the amount of the dopant present in the second conductivity-type layer 2 is reduced and the surface resistance of the substrate is increased; hence, the property F. F. of the solar cell element is reduced. This is not preferred.

The peak concentration is preferably $8\times10^{20}$ [atoms/cm$^3$] or more. Since the high-concentration dopant layer $2b$, which has a high dopant concentration, is formed near the light-receiving surface of the silicon substrate, a large number of carriers responsible for electrical conduction are generated, a photocurrent is efficiently transmitted to the electrode, and the contact between the silicon substrate and the electrode is increased. This is preferred. The sheet resistance is preferably 70 to 150 Ω/square. The solar cell element has a high peak concentration and a high sheet resistance and therefore is high in efficiency.

When the light-receiving surface of the semiconductor substrate has fine irregularities, the light-receiving surface thereof has an increased ability to reducing the reflectance of light. Therefore, the semiconductor substrate absorbs a larger quantity of sunlight and a combination of the increased contact area between the semiconductor substrate and the electrode and the formation of the high-concentration dopant layer enhances ohmic properties of the semiconductor substrate and the electrode. This is preferred. The irregularities may be fine bumps that preferably have a width and height of 2 μm or less and more preferably 1 μm or less. The irregularities preferably have an aspect ratio (height/width) of 0.1 to 2.

The dopant profile can be determined by SIMS analysis. SIMS is a technique in which an accelerated, focused primary ion beam (oxygen, cesium, or the like, particularly Cs herein) is applied to a sample in a vacuum and secondary ions are separated from particles, ejected from the surface of the sample by sputtering, with an electric field to analyze the mass of the sample. The absolute concentration can be calculated from the comparison of the sample with a reference sample. Measurement conditions used herein are as described below.

Instrument used: Cameca IMS-4f
Primary ion species: $Cs^+$
Primary ion acceleration voltage: 14.5 kV
Primary ion current: 120 nA
Luster region: 125 μm
Analysis region: 30 μm φ
Vacuum degree: 1E-7

SIMS analysis includes a depth profile analysis mode and a bulk profile analysis mode. The former mode is used to determine the depth profile (depthwise concentration distribution) of the impurity. Either of the analysis modes can be used to determine the average concentration of the impurity in the substrate. When the sensitivity of analysis needs to be increased because the concentration of the impurity is very low, the bulk profile analysis mode is preferably used. An analysis element may be separately prepared for measurement. For example, single-crystalline silicon substrates mirror-etched with a mixture of hydrofluoric acid and nitric acid may be subjected to distribution under the same conditions and then to SIMS analysis.

[Formation of Antireflective Coating]

An antireflective coating 3 is formed on the second conductivity-type layer 2 of the semiconductor substrate 1. Examples of the antireflective coating 3 include a SiNx coating (the fraction (x) of a component varies around $Si_3N_4$ stoichiometry), a $TiO_2$ coating, a $SiO_2$ coating, a MgO coating, an ITO coating, a $SnO_2$ coating, and a ZnO coating. When the semiconductor substrate 1 is a silicon substrate, the antireflective coating 3 has a refractive index of about 1.8 to 2.3 and a thickness of about 500 to 1200 Å. This is effective in reducing the reflection of light. The antireflective coating 3 is formed by a PECVD process, a vapor deposition process, a sputtering process, or a similar process. In the case where a fire-through process below is not used to form front-side electrodes 5, the antireflective coating 3 is patterned so as to have a predetermined pattern for forming the front-side electrodes 5. Examples of a patterning process include an etching process (wet or dry) using a resist mask and a process in which a mask is formed in advance of forming the antireflective coating 3 and then removed subsequently to the formation of the antireflective coating 3. If the fire-through process is used in such a manner that an electrode paste for forming the front-side electrodes 5 is applied directly onto the antireflective coating 3 and then baked such that the front-side electrodes 5 are electrically connected to the second conductivity-type layer 2, the antireflective coating 3 need not be patterned.

A BSF layer 4 having an impurity concentration greater than that of the semiconductor substrate 1 is formed on the back surface side of the semiconductor substrate 1. When the first conductivity type is the p-type, B or Al (aluminum) is used as an impurity element, whereby a $p^+$-type layer is obtained. This allows the recombination loss of carriers present near the back surface of the semiconductor substrate 1 to be reduced. The BSF layer 4 can be formed in such a manner that the semiconductor substrate 1 is heavily doped with a first conductivity-type impurity. For example, a diffusion barrier such as an oxide layer is formed on the second conductivity-type layer 2 formed in advance. The BSF layer 4 is formed at a temperature of about 800° C. to 1100° C. by thermal diffusion process using $BBr_3$ (boron tribromide) as a diffusion source. In the case of using Al as an impurity element, the BSF layer 4 can be formed in such a manner that an Al paste containing Al powder and an organic vehicle is applied to the semiconductor substrate 1 by a printing process and then heat-treated (fired) at a temperature of about 600° C. to 850° C. such that Al is diffused in the semiconductor substrate 1. The use of such a technique in which the Al paste is printed and then fired allows a desired diffusion region to be formed only in a printing surface. If the second conductivity-type layer 2 is formed on the back surface side, the second conductivity-type layer 2 formed on the back surface side need not be removed. Fired Al need not be removed and can be used to form collector electrodes 6b included in a back-side electrode.

The front-side electrodes 5 are formed on the front surface of the semiconductor substrate 1 and the back-side electrode 6 that includes power-extracting electrodes 6a and the collector electrodes 6b is formed on the back surface thereof. The back-side electrode 6 is in ohmic contact with the BSF layer 4.

The front-side electrodes 5 are formed in such a manner that an electrode paste prepared by mixing, for example, a metal powder containing silver or the like, an organic vehicle, and a glass frit is applied to the front surface such that a predetermined electrode pattern is formed as shown in FIG. 2(a). The amount of the organic vehicle and that of the glass frit are 10 to 30 and 0.1 to five parts by weight, respectively, per 100 parts by weight of silver. A screen printing process can be used for the application the electrode paste. After being applied thereto, the electrode paste is preferably dried in such a manner that a solvent is evaporated at a predetermined temperature of, for example, about 150° C.

The power-extracting electrodes 6a, which are included in the back-side electrode 6, as well as the front-side electrodes 5 are formed in such a manner that an electrode paste prepared by mixing, for example, a metal powder containing silver particles or the like, an organic vehicle, and a glass frit is applied to the back surface such that an electrode pattern is formed as shown in FIG. 2(b). The amount of this organic vehicle and that of this glass frit are 10 to 30 and 0.1 to five parts by weight, respectively, per 100 parts by weight of silver. A screen printing process can be used for the application this electrode paste. After being applied thereto, this electrode paste is preferably dried in such a manner that a solvent is evaporated at a predetermined temperature of, for example, about 150° C.

The collector electrodes 6b, which are included in the back-side electrode 6, is formed in such a manner that an electrode paste prepared by mixing, for example, a metal powder containing aluminum particles or the like, an organic vehicle, and a glass frit is applied to the back surface such that an electrode pattern is formed as shown in FIG. 2(b). The amount of this organic vehicle and that of this glass frit are 10 to 30 and 0.1 to five parts by weight, respectively, per 100 parts by weight of silver. The collector electrodes 6b and the power-extracting electrodes 6a are preferably formed so as to partly overlap with each other in such a manner that this electrode paste is preferably applied over the back surface of the substrate such that the power-extracting portions 6a are partly exposed. A screen printing process can be used for the application this electrode paste. After being applied thereto, this electrode paste is preferably dried in such a manner that a solvent is evaporated at a predetermined temperature of, for example, about 150° C.

The power-extracting electrodes 6a and the collector electrodes 6b may be formed by the application of the silver-containing paste and the aluminum-containing paste, respectively, in that order, or vice versa.

The front-side electrodes 5 and back-side electrode 6 (power-extracting portions 6a and power-collecting portions 6b) applied and then dried as described above are fired at a maximum temperature of 450° C. to 850° C., more preferably 500° C. or higher, for several tens of seconds to several tens of minutes, whereby electrodes can be formed on principal surfaces of the semiconductor substrate 1.

The solar cell element can be formed through the above steps.

(Second Embodiment)

A second embodiment of forming a second conductivity-type layer will now be described with reference to FIG. 5. Those different from the first embodiment are principally described below.

A material containing a dopant having a second conductivity type is applied to a semiconductor substrate having a first conductivity type. The semiconductor substrate is heated with a first heating unit having a first peak wavelength. The semiconductor substrate is then heated with a second heating unit having a second peak wavelength less than the first peak wavelength. This allows the following layers to be formed with high accuracy: a second conductivity-type layer that includes a high-concentration dopant layer 2b located near the surface of the semiconductor substrate and a low-concentration dopant layer 2a located more inside the substrate than the high-concentration dopant layer. Therefore, a large number of carriers responsible for electrical conduction are generated, a photocurrent is efficiently transmitted to an electrode, the recombination rate of minority carriers is reduced, and the photocurrent generated by photoelectric conversion can be increased.

A method for manufacturing a solar cell element according to this embodiment is described below in detail.

As shown in FIG. 5(a), a coating material 7 containing a dopant is applied to a semiconductor substrate 1. The dopant contains a phosphorus salt such as a phosphorus oxide or phosphoric acid or a boron salt such as boron oxide or boric acid. The coating material 7 is one prepared by mixing a silicon compound such as ethyl silicate or polysilazane with a solvent such as ethyl alcohol, isopropyl alcohol, or butyl alcohol and may further contain a resin such as methyl cellulose, ethyl cellulose, nitrocellulose, methyl methacrylate, or polyethylene glycol as required.

Examples of a coating process used include spin coating, spray coating, and screen printing. The viscosity of the coating material 7 may be appropriately adjusted depending on the coating process used and is about 50 to 350 Pa·s in the case of using screen printing. After being applied thereto, the coating material 7 may be dried at a temperature of 70° C. to 150° C. for several minutes.

[First Heat Treatment Step]

As shown in FIG. 5(b), the semiconductor substrate 1 coated with the coating material 7 is heat-treated in an inert gas atmosphere containing argon, nitrogen, or the like or an oxidizing atmosphere containing oxygen or the like using a first heating unit. This allows the coating material 7 to be vitrified into a glass layer 8 containing the dopant and also allows the dopant in the glass layer 8 to be diffused in a surface portion and inner portion of the semiconductor substrate 1, resulting in the formation of a low-concentration dopant layer 2a in the silicon substrate 1.

The first heating unit preferably includes a heater, such as a resistance coil or a halogen lamp, having a peak wavelength of 0.7 to 1000 μm (infrared region), more preferably 25 μm or less. This allows the low-concentration dopant layer 2a to be positioned at an inwardly deeper location of the substrate; hence, the recombination rate of minority carriers can be reduced and the photocurrent generated by photoelectric conversion can be increased.

The heat treatment temperature of this step is preferably varied stepwise. For example, after the substrate is heated at a temperature of 300° C. to 600° C. for 5 to 20 minutes, the substrate may be heated at a temperature of 600° C. to 900° C. for 10 to 40 minutes such that the dopant in the glass layer 8 is diffused in the substrate. This allows the coating material 7 to be vitrified and the low-concentration dopant layer 2b to be formed with high efficiency. The heat treatment temperature of this step may be continuously varied within a predetermined range. For example, the substrate is heated from 500° C. to 850° C. at a rate of 10° C./min, whereby desired properties can be achieved with high accuracy.

[Second Heat Treatment Step]

As shown in FIG. 5(c), the semiconductor substrate is heat-treated in an inert gas atmosphere using a second heating unit with a peak wavelength less than that of the first heating unit.

This allows only a surface portion of the semiconductor substrate to be heated and therefore allows the dopant in the glass layer 8, which is formed in the first heat treatment step, to be diffused in a narrow surface region of the semiconductor substrate 1; hence, a high-concentration dopant layer 2b with a high dopant concentration can be formed near the surface of the substrate. Therefore, a large number of carriers responsible for electrical conduction are generated and a photocurrent can be efficiently transmitted to an electrode.

In particular, the semiconductor substrate 1 is set in, for example, a vacuum chamber which includes a heater made of silicon carbide and which therefore has a substrate-heating function. After being subjected to nitrogen substitution, the chamber is filled with nitrogen at atmospheric pressure. The surface of semiconductor substrate 1 may be heat-treated for about 0.001 second to several tens of seconds in such a manner that the semiconductor substrate is maintained at about 500° C. and is irradiated with light, emitted from a lamp included in the second heating unit, through an upper transmissive window mounted in the chamber. The upper transmissive window has an area greater than or equal to that of the semiconductor substrate and is made of quartz glass.

When the second heating unit is a heater, such as a xenon flash lamp, having a peak wavelength of 197 nm or more and less than 700 nm, which is less than infrared wavelengths, the high-concentration dopant layer can be formed in a narrow surface region of the semiconductor substrate 1 by heating only a surface portion of the semiconductor substrate 1.

After this step is finished, the glass layer 8r which is disposed on the silicon substrate, may be removed by wet etching or the like using a hydrofluoric acid solution such as an aqueous solution containing 0.1 to 50 weight percent hydrofluoric acid or an acid mixture (a mixture prepared by mixing hydrofluoric acid and nitric acid at a ratio of, for example, 1:10).

Before being subjected to the coating step, the semiconductor substrate 1 is preferably subjected to a hydrophilization step in which the wettability of the semiconductor substrate 1 to the coating material 7 is improved. The hydrophilization step reduces the contact angle between the semiconductor substrate and the coating material to improve the wettability thereof. The improvement of the wettability allows the coating material 7, which contains the dopant, to be uniformly applied to the semiconductor substrate 1; hence, the second conductivity-type layer 2 can be uniformly formed in the plane of the semiconductor substrate 1. The semiconductor substrate may be hydrophilized in such a manner that the semiconductor substrate is immersed in an aqueous solution containing ammonia and aqueous hydrogen peroxide, an aqueous solution containing hydrochloric acid and aqueous hydrogen peroxide, an aqueous solution containing ozone, or the like or is thermally oxidized in a dry oxygen atmosphere (the atmosphere may be diluted with nitrogen).

Before being subjected to the coating step or the hydrophilization step, which is not necessarily performed, the silicon substrate is preferably subjected to a cleaning step in which the silicon substrate is treated with a hydrofluoric acid solution or the like so as to be surface-cleaned.

The present invention is not limited to the above embodiments. Various modifications and improvements may be made within the scope of the present invention.

In the case of using, for example, a heater generating near- or middle-infrared rays with a wavelength of 0.7 to 3 μm, the dopant in the high-concentration dopant layer 2b can be electrically activated.

EXAMPLE 1

Examples of the solar cell element-manufacturing method according to the first embodiment will now be described.

A solar cell element was prepared in each example as described below.

A second conductivity-type layer 2 and an antireflective coating 3 were formed on a semiconductor substrate 1, made of p-type polycrystalline silicon, having a thickness of 200 μm and outer dimensions of 15 cm×15 cm in that order by a procedure below.

As shown in FIG. 2, an Al paste was applied substantially over the back surface and a silver paste was applied to the front surface and the back surface. The pastes were dried and then fired such that front-side electrodes 5, power-extracting electrodes 6a, collector electrodes 6b, and a back-side electric field region 4 were formed, whereby the solar cell element was prepared.

The second conductivity-type layer 2 was formed as described below.

The substrate was heat-treated at 700° C. for 15 minutes in an atmosphere containing phosphorus, which was a dopant, in such a manner that the ratio of the flow rate of a diffusion gas to that of an inert gas was adjusted to 1:10 (a first step). The flow rate of the diffusion gas was reduced to zero and the substrate was heat-treated at 850° C. for nine minutes in a nitrogen atmosphere (a second step). The substrate was finally heat-treated at 720° C., 760° C., 810° C., 840° C., or 860° C. for ten minutes in an atmosphere containing the dopant in such a manner that the ratio of the flow rate of the diffusion gas to that of the inert gas was adjusted to 1:10 (a third step).

A solar cell element was prepared in a comparative example as described below. Those not described below are the same as those described in the above example.

A substrate was heat-treated at 700° C. for 12 minutes in an atmosphere containing a dopant in such a manner that the ratio of the flow rate of the diffusion gas to that of the inert gas was adjusted to 1:10. The flow rate of the diffusion gas was reduced to zero and this substrate was heat-treated at 850° C. for nine minutes in a nitrogen atmosphere.

The solar cell elements prepared as described above were measured for V-I properties under AM 1.5 conditions using a solar simulator. The concentration gradient of the dopant from the position of the peak concentration toward the inside of each substrate was calculated from SIMS analysis. The dopant concentration gradient was a substrate depth at which the concentration of the dopant was 1×10 [atoms/cm$^3$] less than the peak concentration thereof. Evaluation results are shown in Table 1.

TABLE 1

|  | 860° C. | 840° C. | 810° C. | 760° C. | 720° C. | Comparative example |
|---|---|---|---|---|---|---|
| Concentration gradient [nm/decade] | 24 | 26 | 30 | 42 | 50 | 59 |
| Pm [W] | 3.740 | 3.762 | 3.792 | 3.737 | 3.705 | 3.664 |
| Isc [A] | 8.079 | 8.105 | 8.082 | 8.048 | 8.033 | 8.015 |
| Voc [V] | 0.614 | 0.614 | 0.615 | 0.615 | 0.615 | 0.612 |
| F.F. | 0.754 | 0.756 | 0.763 | 0.755 | 0.750 | 0.747 |
| Eff [%] | 16.62 | 16.72 | 16.85 | 16.61 | 16.47 | 16.28 |

Table 1 shows that each example of the present invention is superior in Isc and F.F. to the comparative example. In particular, heat treatment performed at a temperature of 760° C. or higher in the third step allows advantages of the present invention to become more remarkable and allows the dopant concentration gradient to be 50 nm/decade or less. It is apparent that a solar cell element with an efficiency of 16.6% or more can be obtained.

A reason for an increase in element efficiency is probably as follows: a large number of carriers responsible for electrical conduction are generated from a high-concentration dopant layer located near the surface of each semiconductor substrate subjected to the above steps, a photocurrent can be efficiently transmitted to an electrode, a low-concentration dopant layer located more inside the substrate than the high-concentration dopant layer reduces the recombination rate of minority carriers in the layer, and the photocurrent generated by photoelectric conversion can be increased. Another reason therefor is probably that the high-concentration dopant layer was electrically activated. The term "activation" as used herein means that donor (or acceptor) atoms are incorporated in the lattice of a semiconductor such as silicon such that electrons (or holes) can be provided.

EXAMPLE 2

Examples of the solar cell element-manufacturing method according to the second embodiment will now be described. forming a second conductivity-type layer is described below in detail, the step being different from that described in Example 1.

A solar cell element was prepared in each example as described below.

A coating material (ethyl silicate, ethyl alcohol, and phosphorus pentoxide) containing a dopant that was phosphorus was applied to the front surface of a semiconductor substrate by a spin coating process and then dried at 90° C. for three minutes (a coating step). The substrate was heat-treated at 500° C. for ten minutes in a nitrogen atmosphere with atmospheric pressure using a sheath heater with a peak wavelength of 10 μm and then further heat-treated at 800° C. for 20 minute (a first heat treatment step). The substrate was finally heat-treated for 0.0015 second in a nitrogen atmosphere with atmospheric pressure using a xenon flash lamp (a maximum heating temperature of 1100° C.) with a peak wavelength of 500 nm for Example 1. Another substrate was heat-treated for ten seconds using a halogen lamp (a maximum heating temperature of 900° C.) with a peak wavelength of 1100 nm for Example 2 (a second heat treatment step).

A solar cell element was prepared in a comparative example as described below. Those not described below are the same as those described in the above example.

A coating material (ethyl silicate, ethyl alcohol, and phosphorus pentoxide) containing a dopant that was phosphorus was applied to the front surface of a semiconductor substrate by a spin coating process and then dried at 90° C. for three minutes. The substrate was heat-treated at 500° C. for ten minutes in a nitrogen atmosphere with atmospheric pressure using a sheath heater with a peak wavelength of 10 μm and then further heat-treated at 800° C. for 20 minute.

The solar cell elements prepared as described above were measured for V-I properties under AM 1.5 conditions using a solar simulator. Evaluation results are shown in Table 2.

TABLE 2

|  | Example 1 | Example 2 | Comparative example |
|---|---|---|---|
| Pm [W] | 3.782 | 3.744 | 3.677 |
| Isc [A] | 8.072 | 8.032 | 8.006 |
| Voc [V] | 0.615 | 0.615 | 0.614 |
| F.F. | 0.762 | 0.758 | 0.748 |
| Eff [%] | 16.81 | 16.64 | 16.34 |

Table 2 shows that each example of the present invention, as well as Example 1, is superior in Isc and F.F. to the comparative example. In particular, heat treatment performed using the xenon flash lamp with a peak wavelength of 500 nm in the second step allows advantages of the present invention to become more remarkable. A reason for an increase in element efficiency is probably the same as that described in Example 1.

Brief Description of Drawings

FIG. 4 is a schematic view of a common diffusion apparatus.

Reference Numerals

Figure 1:
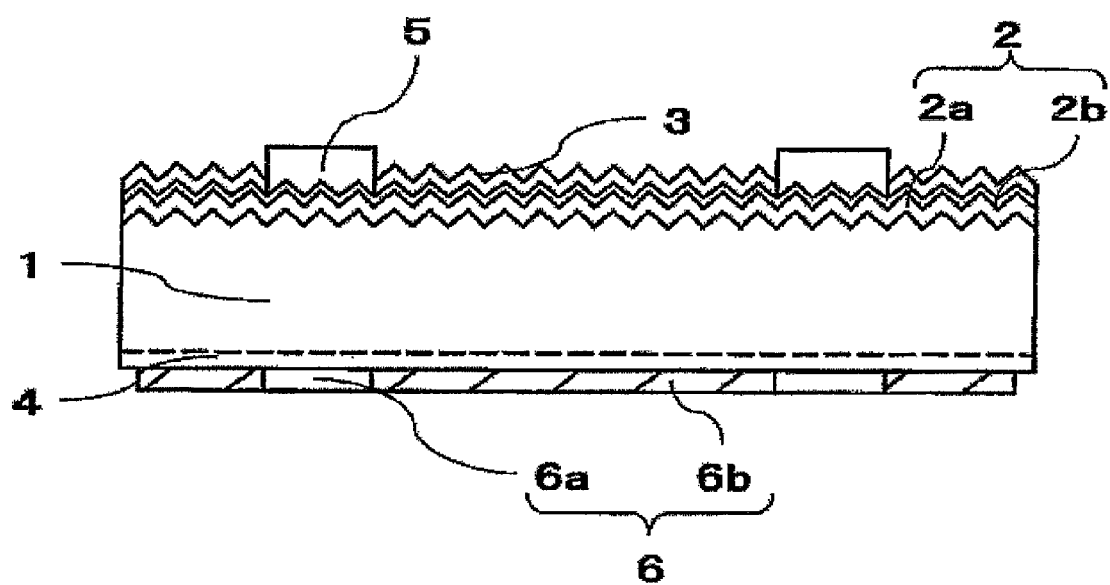
FIG. 1 is an illustration showing an example of a solar cell element according to the present invention.
Figure 2:
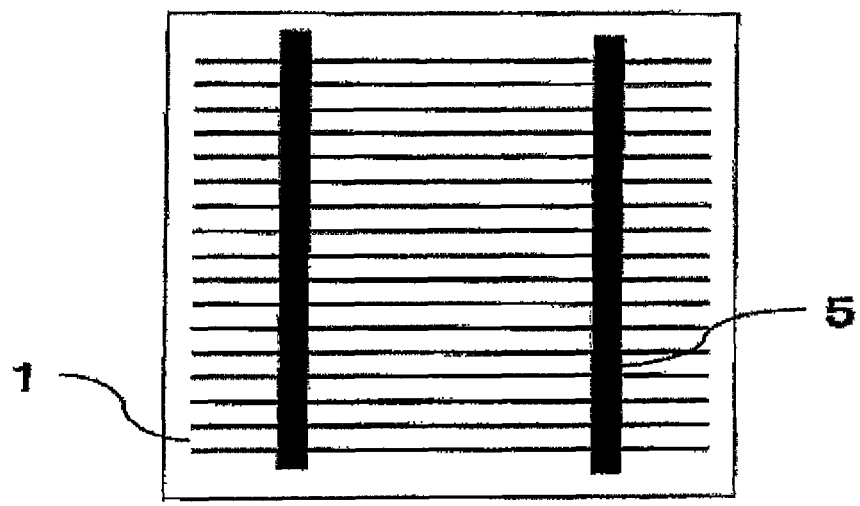
FIG. 2($a$) is an illustration showing an example of the shape of electrodes disposed on the light-receiving surface side (front surface) of a solar cell element according to the present invention and FIG. 2($b$) is an illustration showing an example of the shape of electrodes disposed on the non-light-receiving surface side (back surface) thereof.
Figure 2:
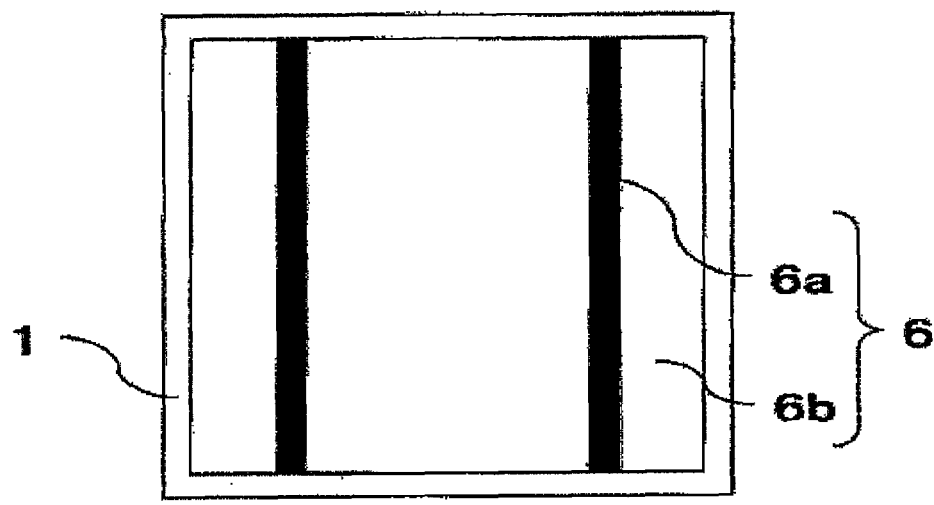
Figure 3:
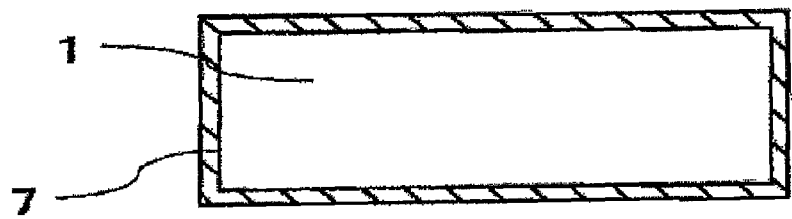
FIG. 3 is an illustration showing a method for manufacturing a solar cell element according to a first embodiment of the present invention.
Figure 3:
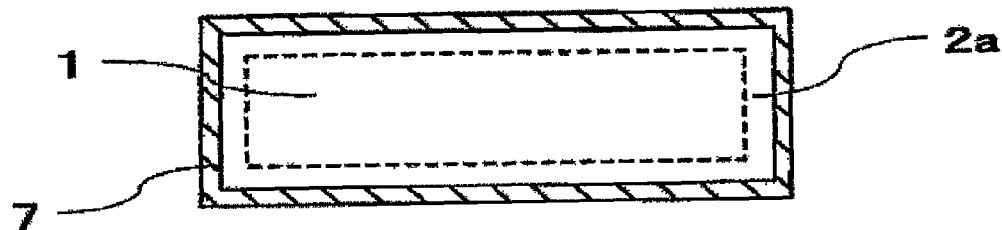
Figure 3:
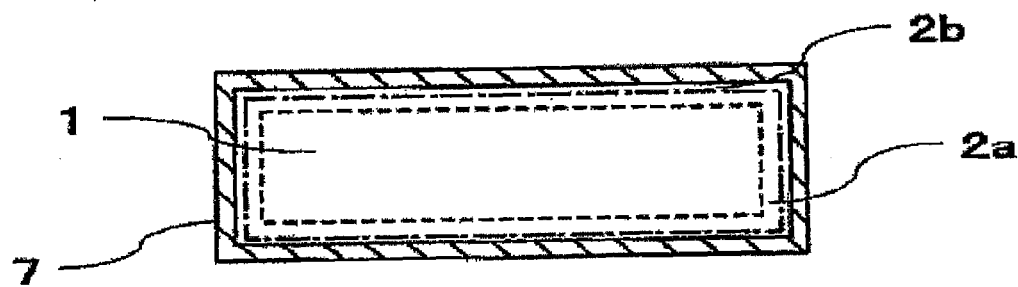
Figure 5:
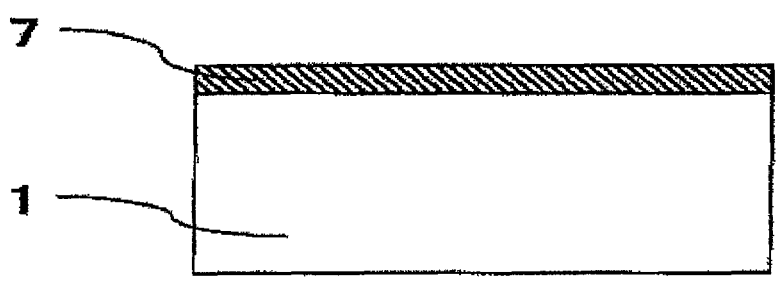
FIG. 5 is an illustration showing a method for manufacturing a solar cell element according to a second embodiment of the present invention.
Figure 5:
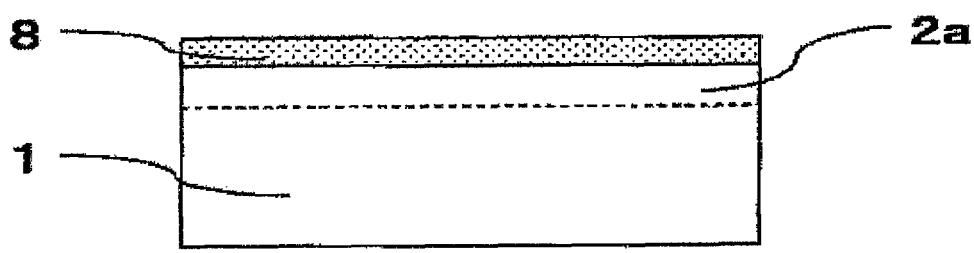
Figure 5:
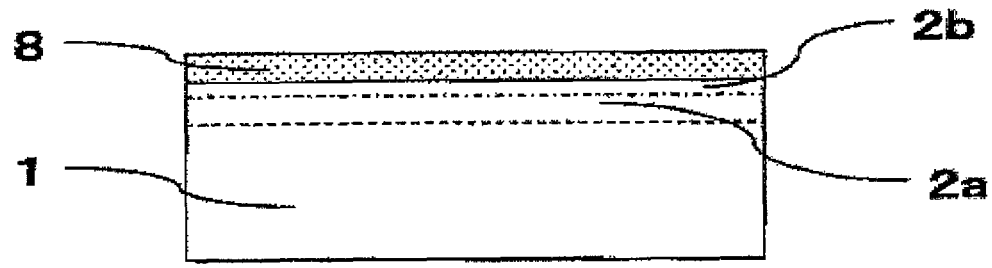

1 semiconductor substrate
2 second conductivity-type layer
2a low-concentration dopant layer
2b high-concentration dopant layer

The invention claimed is:

1. A method for manufacturing a solar cell element, comprising:
a first step of heating, at a temperature, T1, a semiconductor substrate having a first conductivity type in a first atmosphere which contains a dopant having a second conductivity type and which has a first dopant concentration,
a second step of heating, at temperature, T2, in a second atmosphere the semiconductor substrate heated in the first atmosphere, the second atmosphere having a second dopant concentration less than the first dopant concentration; and
a third step of heating, at temperature, T3, in a third atmosphere the semiconductor substrate heated in the second atmosphere, the third atmosphere having a third dopant concentration greater than the second dopant concentration,
wherein the first conductivity type and the second conductivity type are different, and
wherein T1<T3, T3<860° C., T1>600° C., T1<T3-30, and T1 and T3 are in units of degrees Celsius.

2. The solar cell element-manufacturing method according to claim 1, wherein the second atmosphere contain no second conductivity-type dopant.

3. The solar cell element-manufacturing method according to claim 1, wherein the third atmosphere is set to have the ratio of the flow rate of a diffusion gas to that of an inert gas from 1:2 to 1:20.

4. The solar cell element-manufacturing method according to claim 1, wherein the semiconductor substrate is heated at 760° C. or higher in the third atmosphere.

5. The solar cell element-manufacturing method according to claim 1, further comprising heating in a fourth atmosphere the semiconductor substrate heated in the third atmosphere, the fourth atmosphere having a fourth dopant concentration less than the third dopant concentration.

6. The solar cell element-manufacturing method according to claim 5, wherein the temperature of the semiconductor substrate heated in the fourth atmosphere is lower than the temperature of the semiconductor substrate heated in the third atmosphere.

7. The solar cell element-manufacturing method according to claim 1, further comprising roughening a surface of the semiconductor substrate.

8. The solar cell element-manufacturing method according to claim 7, further comprising forming an antireflective coating on the roughened surface of the semiconductor substrate.

9. The solar cell element-manufacturing method according to claim 1, wherein after the semiconductor substrate is surface-cleaned, the semiconductor substrate is heated in the first atmosphere.

10. The solar cell element-manufacturing method according to claim 1, wherein T3 ranges from 810° C. to 840° C.

* * * * *